US012660095B2

(12) United States Patent
Harrigan et al.

(10) Patent No.: US 12,660,095 B2
(45) Date of Patent: Jun. 16, 2026

(54) MODULAR ROUTABLE CIRCUIT BOARD CONDUCTOR BLOCKS

(71) Applicant: Microsoft Technology Licensing, LLC, Redmond, WA (US)

(72) Inventors: Jason Harrigan, Sultan, WA (US); Kajsa Ava Johnson, Seattle, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 224 days.

(21) Appl. No.: 18/315,105

(22) Filed: May 10, 2023

(65) Prior Publication Data

US 2024/0381541 A1 Nov. 14, 2024

(51) Int. Cl.
| | |
|---|---|
| *H05K 3/341* | (2026.01) |
| *H05K 1/181* | (2026.01) |
| *H05K 3/303* | (2026.01) |
| H05K 3/00 | (2006.01) |

(52) U.S. Cl.
CPC ............. *H05K 3/341* (2013.01); *H05K 1/181* (2013.01); *H05K 3/305* (2013.01); *H05K 3/0005* (2013.01); *H05K 2201/0364* (2013.01)

(58) Field of Classification Search
CPC .................................................... H05K 3/341
USPC ........................................................ 361/761
See application file for complete search history.

(56) References Cited

U.S. PATENT DOCUMENTS

| | | |
|---|---|---|
| 6,114,769 A | 9/2000 | Thompson, Sr. |
| 6,610,430 B1 | 8/2003 | Thompson, Sr. |
| 6,821,878 B2 | 11/2004 | Danvir et al. |
| 7,446,028 B2 | 11/2008 | Hiatt et al. |
| 2008/0092991 A1 | 4/2008 | Martin et al. |
| 2008/0164298 A1 | 7/2008 | Koopmans |
| 2010/0025090 A1 | 2/2010 | Delay |
| 2011/0113400 A1 | 5/2011 | Melzner et al. |

(Continued)

FOREIGN PATENT DOCUMENTS

| | | |
|---|---|---|
| CN | 100470772 C | 3/2009 |
| CN | 102075180 B | 7/2012 |

(Continued)

OTHER PUBLICATIONS

"A Closer Look at the PCB Plated Through-Hole Process", Retrieved from: https://resources.pcb.cadence.com/blog/2022-a-closer-look-at-the-pcb-plated-through-hole-process, Retrieved Date: Mar. 10, 2023, 8 Pages.

(Continued)

*Primary Examiner* — Stanley Tso

(57) ABSTRACT

Techniques, elements, and assemblies for high current board-level conductive pathways on printed circuit boards are provided. In one example, a method includes providing a circuit board having footprint elements that define a route between endpoints. The method includes applying solder paste onto the footprint elements, and placing modular conductive blocks along the route onto the solder paste associated with the footprint elements. The method also includes forming, by at least a solder reflow operation, an assembly comprising the circuit board and the modular conductive blocks that establishes a conductive pathway along the route with series coupling of the modular conductive blocks to each other.

8 Claims, 11 Drawing Sheets

(56)                References Cited

U.S. PATENT DOCUMENTS

| 2013/0264716 | A1 |    | 10/2013 | Lin et al. |  |
|---|---|---|---|---|---|
| 2014/0124248 | A1 | * | 5/2014 | Peck | H05K 1/0254 |
|  |  |  |  |  | 174/250 |
| 2014/0338964 | A1 | * | 11/2014 | Berglund | H05K 1/0263 |
|  |  |  |  |  | 174/261 |
| 2014/0369006 | A1 |    | 12/2014 | Williams |  |
| 2015/0109738 | A1 |    | 4/2015 | Yamada et al. |  |
| 2015/0236607 | A1 | * | 8/2015 | Zhao | H02M 7/537 |
|  |  |  |  |  | 361/752 |
| 2018/0090460 | A1 |    | 3/2018 | Chu |  |

FOREIGN PATENT DOCUMENTS

| CN | 103378119 | B |   | 2/2016 |
|---|---|---|---|---|
| CN | 105453709 | A |   | 3/2016 |
| CN | 105904046 | A |   | 8/2016 |
| CN | 104759725 | B |   | 10/2016 |
| CN | 106457689 | A |   | 2/2017 |
| CN | 106158773 | B |   | 12/2018 |
| CN | 106465545 | B |   | 5/2019 |
| CN | 108337821 | B |   | 8/2019 |
| CN | 106538073 | B |   | 11/2019 |
| CN | 107251676 | B |   | 11/2019 |
| CN | 109451663 | B |   | 6/2020 |
| CN | 107482338 | B |   | 11/2021 |
| CN | 215955515 | U |   | 3/2022 |
| CN | 113613407 | B |   | 7/2022 |
| DE | 102011018851 | B4 |   | 4/2015 |
| JP | 2020502748 | A |   | 1/2020 |
| JP | 2020 502748 |  | * | 2/2020 |
| KR | 100852292 | B1 |   | 8/2008 |
| WO | 2020157149 | A1 |   | 8/2020 |
| WO | 2023029434 | A1 |   | 3/2023 |
| WO | WO 2023/029434 |  | * | 3/2023 |

OTHER PUBLICATIONS

"Altium Split Plane", Retrieved from: https://www.altium.com/documentation/altium-designer/pcb-dlg-splitplanesplit-plane-ad?version=22, Jun. 9, 2022, 2 Pages.

"Automated Routing for PCB", Retrieved from: https://www.tessolve.com/automated-routing-for-pcb/, Jun. 10, 2022, 4 Pages.

"Taking a Circuit Board through OrCAD Layout for the First Time", Retrieved from: https://resources.pcb.cadence.com/blog/2020-taking-a-circuit-board-through-orcad-layout-for-the-first-time, Retrieved Date: Mar. 10, 2023, 8 Pages.

Ghosh, Poulomi, "How to Design a Via with Current Carrying Capacity", Retrieved from: https://www.protoexpress.com/blog/how-to-design-via-with-current-carrying-capacity/, Mar. 17, 2022, 14 Pages.

John, General, "High Current PCB—How to Design and Optimise to Make it More Perfect", Retrieved from: https://www.ourpcb.com/high-current-pcb.html, Retrieved Date : Mar. 20, 2023, 12 Pages.

Peterson, Zachariah, "PCB Via Current-Carrying Capacity: Is My PCB Too Hot?", Retrieved from: https://resources.altium.com/p/pcb-current-carrying-capacity-how-hot-too-hot, Apr. 28, 2020, 5 Pages.

International Search Report and Written Opinion received for PCT Application No. PCT/US2024/028226, Sep. 2, 2024, 16 pages.

International Preliminary Report on Patentability (Chapter I) received for PCT Application No. PCT/US2024/028226, Mailed on Nov. 20, 2025, 10 Pages.

* cited by examiner

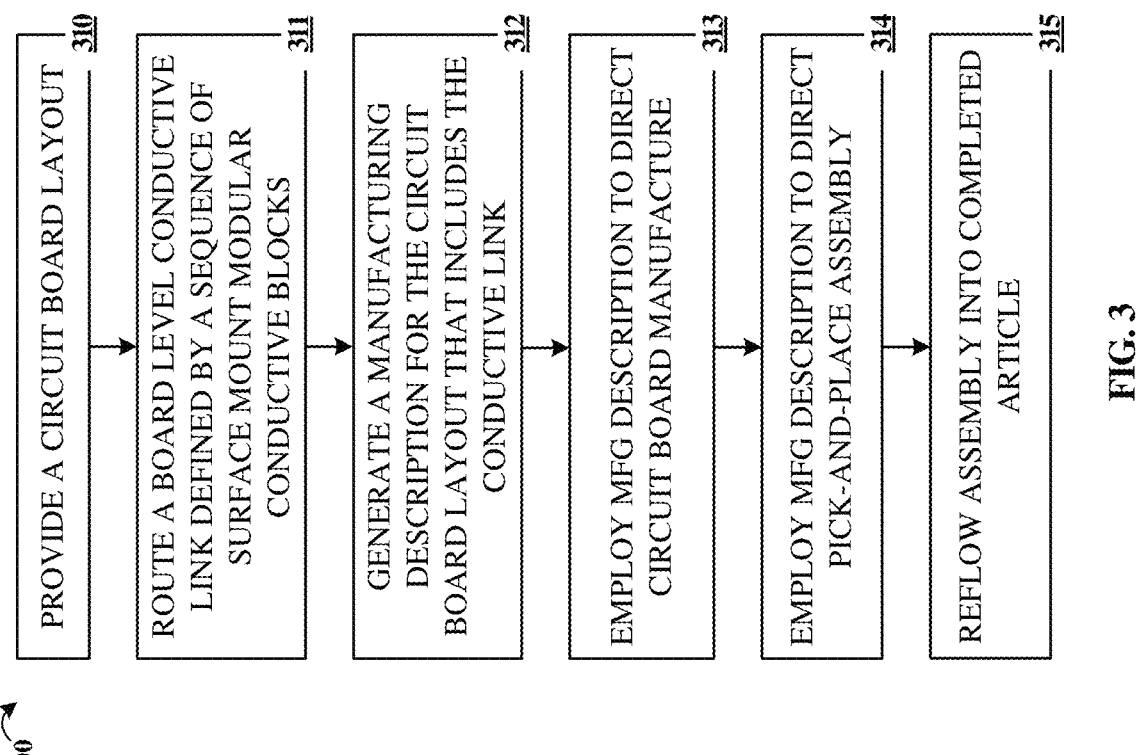

PROVIDE A CIRCUIT BOARD LAYOUT 310

ROUTE A BOARD LEVEL CONDUCTIVE LINK DEFINED BY A SEQUENCE OF SURFACE MOUNT MODULAR CONDUCTIVE BLOCKS 311

GENERATE A MANUFACTURING DESCRIPTION FOR THE CIRCUIT BOARD LAYOUT THAT INCLUDES THE CONDUCTIVE LINK 312

EMPLOY MFG DESCRIPTION TO DIRECT CIRCUIT BOARD MANUFACTURE 313

EMPLOY MFG DESCRIPTION TO DIRECT PICK-AND-PLACE ASSEMBLY 314

REFLOW ASSEMBLY INTO COMPLETED ARTICLE 315

MODULAR ROUTABLE CIRCUIT BOARD CONDUCTOR BLOCKS

BACKGROUND

Circuit boards typically include various conductive traces that route signaling and power connections between various circuit elements, such as data signaling among integrated circuit devices and power connections provided by power regulation devices. Various internal and external (surface) layers can be included in circuit boards to provide this signal routing as well as provide planes and traces for power/ground distribution. One of the challenges in circuit board design, especially for designs that include high power consumption components, is routing power around the circuit board efficiently. Tradeoffs such as cost, size, and performance usually have to be made to accommodate power distribution along with high-density and high-speed signal routing.

For traces employed as power links on circuit boards, a given amount of current requires an associated cross section of conductor. This can drive wider power traces and the use of thick copper power planes, both of which consume more circuit board routable area and increase cost and complexity. In some cases, the power delivery requirements between two parts of the circuit board can dictate the stack-up of the entire circuit board or force large areas of the board to be dedicated to deliver the current. Furthermore, even if there is generally enough room on the board to provide an adequate cross-sectional area of copper, pinch points can cause issues for signal integrity, electromagnetic interference, and complexity in signal routing.

While discrete wires or jumpers can be employed to suit larger current capacities, wired or stamped-metal solutions are not compatible with modern manufacturing techniques, such as pick-and-place operations, requiring manual technician assembly or large connectors which take up valuable real estate on a circuit board and still necessitate separate wiring harness assembly and testing. Moreover, discrete wires or jumpers can lead to electromagnetic interference (EMI) issues by having offset distances from the underlying circuit board, forming unwanted current loops and parasitic inductances.

SUMMARY

Techniques, elements, and assemblies for high current board-level conductive pathways on circuit boards are provided. The examples herein discuss Board-Level Cables (BLCs) which can overcome challenges with routing of high-current power distribution links between circuit board-mounted devices. BLCs can include modular surface mount device (SMD) block or brick components that provide current delivery separate from PCB traces/planes. The configurations discussed herein can potentially save size, weight, and cost while simultaneously improving power performance and lower DC resistance. There are two main types of BLCs discussed herein, a reflowable type and a non-reflowable modular type.

In one example, a method includes providing a circuit board having footprint elements that define a route between endpoints. The method includes applying solder paste onto the footprint elements, and placing modular conductive blocks along the route onto the solder paste associated with the footprint elements. The method also includes forming, by at least a solder reflow operation, an assembly comprising the circuit board and the modular conductive blocks that establishes a conductive pathway along the route with series coupling of the modular conductive blocks to each other.

In another example, an assembly includes a circuit board comprising a route, and a series of modular conductive blocks soldered onto footprint elements placed onto the circuit board along the route. Each of the modular conductive blocks has a longitudinal body comprising an electrically conductive material and are configured to electrically couple at end portions to one or more adjacent conductive blocks.

In yet another example, a method includes providing a circuit board layout. In the circuit board layout, the method includes routing a conductive link defined by a sequence of surface mount conductive bricks, and generating a manufacturing description for the circuit board layout that includes the conductive link. The method can also include employing the manufacturing description to direct manufacture of a printed circuit board assembly including pick-and-place operations for mounting the conductive bricks onto footprints established on the printed circuit board.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

FIG. 3 illustrates example circuit board assembly operations in an implementation.

DETAILED DESCRIPTION

Many computing systems employ high-performance integrated circuit devices, such as system-on-a-chip (SoC) devices, central processing units (CPUs), or graphics processing units (GPUs), among other large-scale integrated circuit devices. These integrated circuit devices receive power provided by various power control and voltage regulator elements which alter a common input power to the system into individually-regulated domains, typically having lower output voltages than provided by the input power. This power is routed from the voltage regulator elements to the individual devices using power deliver networks (PDNs). PDNs comprise the circuit routing, circuit board power planes, capacitive structures, and power delivery components like regulators, power FETs, diodes, or other such devices that form the electrical pathways extending from voltage regulators to the circuit devices, and can also include connections on a circuit board for the integrated circuit device, packaging/carrier pathways for the integrated circuit device, and power distribution elements within the semiconductor and metallization structures of the integrated circuit device itself to delivery power to active circuit components.

For traces employed as power links on (or in) circuit boards, a given amount of current requires an associated cross section of conductor. This can drive wider power traces and the use of thick copper power planes, both of which consume more circuit board routable area and increase cost and complexity. Techniques, elements, and assemblies for high current board-level conductive pathways on circuit boards are provided. The examples herein discuss Board-Level Cables (BLCs) which can overcome challenges with routing of high-current power distribution links between circuit board-mounted devices. BLCs can include modular surface mount device (SMD) block or brick components that provide current delivery separate from PCB traces/planes. The configurations discussed herein can potentially save size, weight, and cost while simultaneously improving power performance and lower DC resistance.

Figure 1:
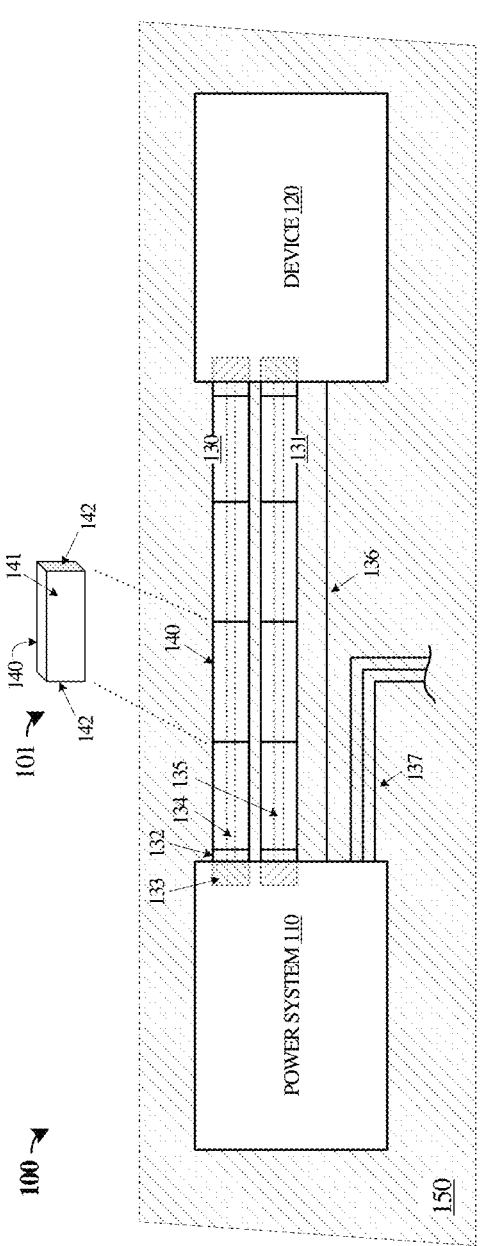
FIG. 1 illustrates a circuit board assembly in an implementation.

Turning to a first example implementation, FIG. 1 is provided. FIG. 1 illustrates circuit board assembly 100 in an implementation. Assembly 100 includes circuit board 150 which has several components mounted thereto, including power system 110, device 120, and various example traces 136-137. Additionally, assembly 100 includes board-level cables (BLCs) 130-131. Only a partial circuit board is shown in FIG. 1 for clarity, and it should be understood that various other components and configurations are possible.

Power system 110 provides electrical power to device 120, among other devices, and can provide various control and status signaling. BLCs 130-131 form conductive links between power system 110 and device 120, and comprise a series of individual modular blocks or bricks. Power system 110 includes circuitry to convert and distribute power to electrical components, including device 120. Power system 110 comprises voltage regulators, power control elements, switching elements, passive components, filters, and electromagnetic interference (EMI) mitigation elements, among other elements used to convert a source voltage into one or more working voltages for devices included on circuit board 150.

Device 120 is representative of a consumer of power provided by power system 110, such as a central processing unit (CPU), system-on-a-chip (SoC), graphics processing unit (GPU), co-processing unit, programmable logic device, memory devices, data storage devices, or any other electronic, integrated circuit, or discrete circuit device. Device 120 receives at least a portion of its power needs from power system 110 over BLCs 130-131. Device 120 also includes many various data interconnection links, buses, control links, status links, and auxiliary power links, which are not shown in FIG. 1 for clarity. In operation, the power requirements of device 120 can vary depending on a workload, and passive energy storage components, such as decoupling capacitors, may be arrayed about a footprint of device 120 to aid in power delivery and EMI/noise reduction. Thus, electrical current is supplied to device 120 over BLCs 130-131 at a particular voltage level.

As mentioned above, BLCs 130-131 are formed from a series of conductive modular blocks or bricks. An example conductive modular block 140 is shown in detailed view 101. Block 140 includes body portion 141, and end portions 142. Body portion 140 comprises a material configured to conduct electrical current between end portions 142. End portions 142 are configured to electrically couple to adjacently positioned conductive modular blocks. Various main categories or types of conductive modular blocks are discussed herein.

A first type of conductive modular blocks includes a reflowable block formed substantially from a reflowable material. During a reflow process, the reflowable block can at least partially melt and self-interconnect with adjacent reflowable blocks formed from similar material. In this first type, body portion 141 and end portions 142 can be comprised of a substantial portion of reflowable material, such as a solder of various compositions. In some examples, the reflowable material of the blocks has a different reflow temperature than solder paste applied to the circuit board (or other components). Solder paste applied to the circuit board for the blocks can be configured to reflow at a different time than reflowable material comprising the blocks or end portions of the blocks. In this manner, the blocks can be made to first self-align onto pads/traces of the circuit board before fusing with adjacent blocks.

A second type of conductive modular block includes a solid or stranded conductor spanning between end portions. In this second type, body portion 141 comprises a non-reflowable composition, such as a solid or woven piece of conductor material (e.g., aluminum, copper, nickel, gold, or other materials and alloys), and end portions 142 comprise a material wettable by a reflowable material (e.g., solder) to couple to adjacent conductive modular blocks. End portions 142 may also contain reflowable solder material, which provides additional solder volume needed to fuse two adjacent blocks.

A third type of conductive modular block includes a subset of the reflowable type of block, but one that includes an internal or external "skeleton" or scaffolding that controls solder reflow behavior through surface tension/wicking properties provided by interaction or adhesion of the scaffolding with the reflowable material. This third configuration can assist in maintaining a cohesive block formation while the solder is melted or reflowed, help the block fuse to adjacent blocks or components, prevent spillage of the solder beyond desired bounds, and maintain electrical continuity of a BLC.

Each conductive modular block of BLCs 130-131 can be placed onto circuit board 150 during an assembly process, and then a subsequent solder reflow process can merge or couple the blocks comprising BLCs 130-131 into a continuous conductor member. For example, pick-and-place techniques can be used to pick conductive modular blocks from bins or caddies and place onto circuit board 150 onto footprint elements that define a pathway between power system 110 and device 120. Example footprint elements are shown for pilot traces 134-135 in FIG. 1. Pilot traces 134-135 can form a conductive pathway between power system 110 and device 120. Pilot traces 134-135 might comprise a continuous route or trace or may be a series of disconnected or floating pads. Solder paste can be applied to solder mask demarcated portions of pilot traces 134-135 onto which conductive modular blocks are then placed. A reflow process then reflows the solder paste and couples the conductive modular blocks into a continuous conductive pathway defining each of BLCs 130-131. Since the conductive modular blocks comprise a cross-sectional area much larger than that of any on-board traces or of pilot traces 134-135, a much larger electrical current can be carried to device 120. While the selection of pads or pilot traces can vary based on application, a series of disconnected pads includes an inherent safety benefit in that if a BLC breaks, stray remaining current would cease to flow, and not be forced through an underlying pilot trace. However, pilot traces may include some reliability enhancements in that current can still flow, albeit with possible joule/ohmic heating, if a BLC breaks.

External connections of device 120 or power system 110 can couple to BLCs 130-131 using various configurations. These external connections can include balls, pins, or bumps, among variations, improvements, and alternatives. In FIG. 1, device connections 133 (e.g., balls or bumps) are shown for device 110. Interworking element 132 couples from pads or traces that connect to device connections 133 and to BLC 130. Similar features are shown for BLC 131 and for device 120. Moreover, BLCs can be configured to couple to off-board connectors and penetrate through circuit board 150, as will be discussed in the examples below. Interworking element 132 might comprise a conventional circuit board trace, but in such cases the cross-sectional area of interworking element 132 might be smaller than the overall BLC and can cause a voltage drop or joule heating.

Figure 2:
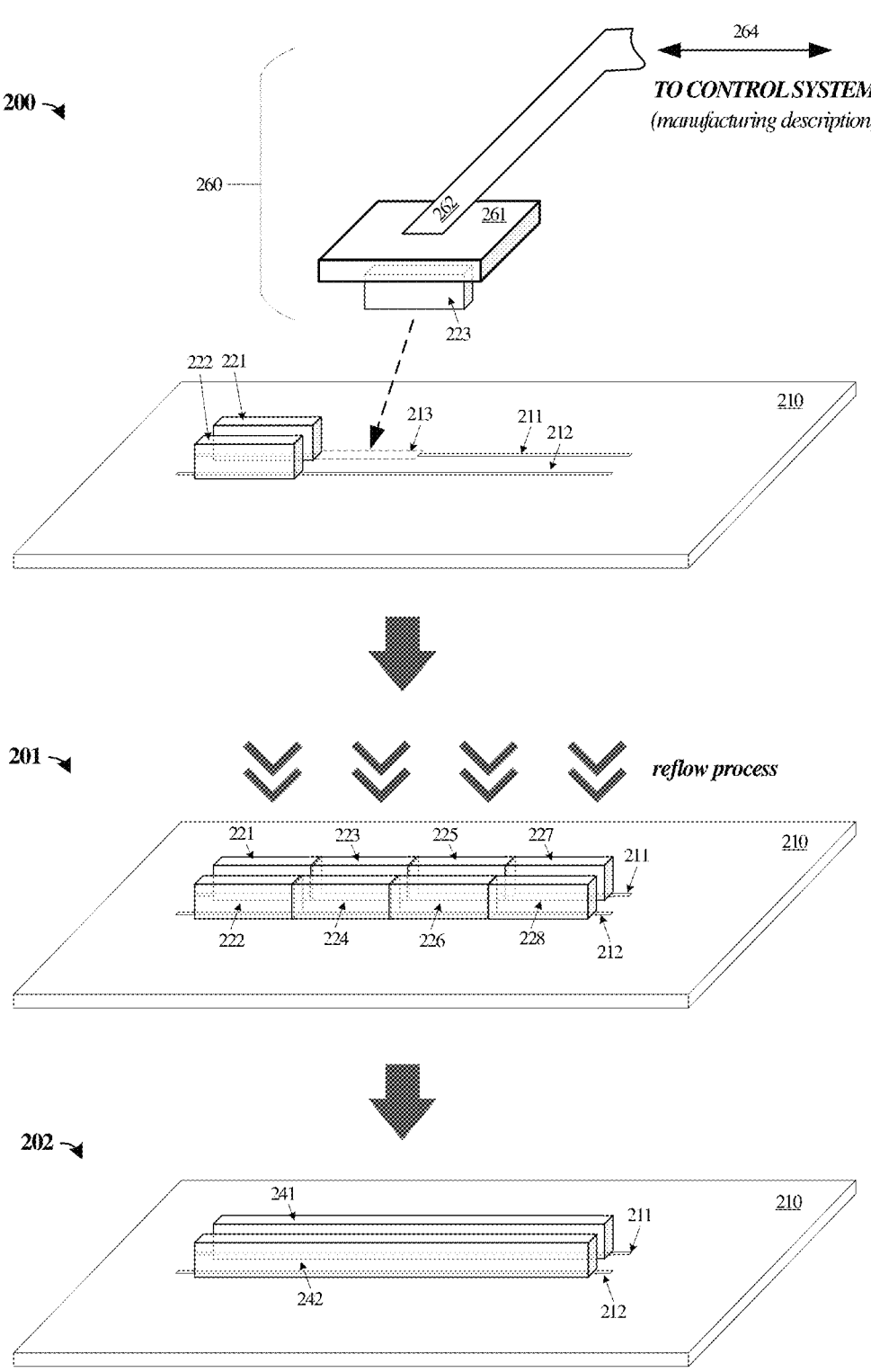
FIG. 2 illustrates example circuit board assembly operations in an implementation.

FIG. 2 is now included to show further examples of conductive modular bricks and assembly into BLCs for use on circuit boards. FIG. 2 includes operational examples 200-202 for elements placed onto circuit board 210. In operational example 200, pick-and-place system 260 is shown carrying conductive modular block 223 for placement onto target location 213 of circuit board 210. Conductive modular blocks 221-222 have already been placed onto circuit board 210 onto pilot traces 211-212. In operational example 201, conductive modular blocks 221-228 have been placed to form two BLCs. Then, a reflow process occurs, which can include heating circuit board 210 and corresponding components to a target temperature such that solder material reflows into a liquid or partial-liquid state. Operation example 202 shows two completed BLCs 241-242 formed from individual conductive modular blocks and placed onto pilot traces 211-212.

The operational examples of FIG. 2 show a modular BLC system comprising conductive modular blocks 221-228 placed on circuit board 210 using surface mount technology (SMT), and these conductive modular blocks are reflowed together with solder wicking between the blocks, forming a continuous cross-sectional path. Solder mask of circuit board 210 can be exposed in a continuous path between two devices, such as a high current source and a high current sink. Solder paste is placed in a pattern along the path, and conductive modular blocks of material are placed along the path. These conductive modular blocks allow for a larger conductor cross-section. During reflow, solder paste wicks in between the space between adjacent conductive modular blocks, creating a continuous BLC of the desired cross section along the high current path. This wicking action is similar to pin-and-paste connector methods. Conductive modular blocks can also contain flux or reflowable solder on the blocks themselves to aid in reflow and interconnection. As discussed in FIG. 9, interface geometries of the conductive modular blocks may also be such that they tesselate with each other to increase the interconnecting surface area and improve solder wicking action.

Advantageously, when reflowable types of conductive modular blocks, pick-and-place bricks of reflowable material can allow for a larger volume of solder which establishes a larger conductor cross section. During reflow, these reflowable bricks at least partially melt and fuse together, creating a continuous BLC of the desired cross section along the high current path. Optional scaffolding or skeleton features (internal or external) can be included to control the amount of reflow as well as characteristics for adjacent block fusing. The reflow characteristics of these reflowable bricks can be different than solder paste, if desired, such that the surface tension, temperature, and viscosity can be adjusted. This configuration can provide flexibility for power delivery, especially at the component level between devices such as voltage regulators and integrated circuit devices where space is critical. Furthermore, reflowable bricks can be placed tactically around routing pinch points, such as close to the device packages of the high current components. In other examples, BLCs can be established between portions of power planes to provide high-current connections among such planes.

Different sizes of conductive modular blocks can be selected based on a desired current carrying capacity for a BLC. If the amount of current required to transfer is very large, such that the surface tension or adhesion becomes an issue with reflow, multiple reflowable BLCs can be run in parallel on top of the same power plane trace, or block scaffolding features can be included. In addition to diameter of conductive modular blocks, cross-sectional geometries of the blocks can be selected as appropriate to different current carrying capabilities or mechanical size constraints. For example, geometries can include "tall skinny" type of blocks or a "low profile but wide" type of blocks. Indeed, a family of differently sized and shaped blocks can be made available for various circuit board layout scenarios. In addition to straight linear blocks that mate in a straight line, blocks can be established to allow for turn radii, angles, or corners, such as for 45° or 90° turns. Blocks of longer lengths can be established for straight runs of a long distance, and blocks can be established to act as bridges to allow other traces to pass underneath of the block on the top layer of a circuit board. Also, as will be discussed below, various insulation or isolation elements can be included on or in the blocks to provide electrical insulation features.

FIG. 3 is now included to illustrate example manufacturing and assembly operations used to produce a circuit assembly having Board-Level Cables (BLCs). The operations of FIG. 3 are discussed in the context of elements of FIG. 2. However, it should be understood that the operations of FIG. 3 can be provided for any of the system or assembly examples herein.

In operation 310, a circuit board layout is provided. This circuit board layout can initially be established in a computer-aided design system, such as a printed circuit board layout software application or similar application/platform that provides for placement and routing of various electronic components, passive components, and traces/routes between such elements. Example circuit board layout software include electronic design automation (EDA) or a computer-aided design (CAD) systems. This printed circuit board layout software might include placeable elements, such as passive components, discrete devices, integrated devices, connectors, sockets, and other various components. Among these placeable elements include conductive modular blocks or bricks, such as those discussed herein. Thus, operation

311 includes routing a board-level conductive link, such as a BLC, defined by a sequence of surface mount conductive modular blocks. In FIG. 2, an example link can be any among BLCs 241-242 which are defined by pilot traces 211-212. These links can be routed between two endpoints, such as between two devices, that benefit from a high current power link, or between two power planes or component break-out traces. Thus, the endpoints might include electronic/electrical components, power planes, power traces, or other elements that might benefit from high-current connections therebetween.

Circuit board layout operations can provide various automated routing and placement features and rules that incorporate BLCs of various types, shapes, compositions, and arrangements. In addition, solder mask configurations for the circuit board can accompany any BLC elements to define an exposed footprint or series of exposed footprints for soldering of the BLC elements to the corresponding circuit board. Example circuit board layout operations can provide inclusion and placement of BLCs when "pinch points" are encountered in circuit board routing/layout which indicates restriction in current carrying capacity of one or more routes or traces. Circuit board layout operations can provide inclusion and placement of BLCs for current-carrying traces/routes in proximity to voltage regulators or similar power conversion elements. Circuit board layout operations can provide inclusion and placement of BLCs in proximity to integrated circuit devices based on pin count vs. physical size of integrated circuit devices, to ensure adequate current carrying capacity can reach high-density pin count devices. Circuit board layout operations can provide inclusion and placement of BLCs in proximity to packages of high-current components. Circuit board layout operations can provide conversion of power traces in circuit board designs into one or more BLCs, such as a plurality of substantially parallel BLCs (e.g., based on surface tension or adhesion limits of blocks during reflow). Circuit board layout operations can provide placement of blocks that include insulation shells onto BLC pathways, including alignment of the rotation of each of the block components such that block gaps align, allowing the reflowable material to wick together and join during reflow. Spacing between the insulation shells can be maintained at or below a safety threshold (e.g., based on the current-carrying capacity of associated BLC pathways, end-user accessibility concerns, or other risk factors).

Figure 10:
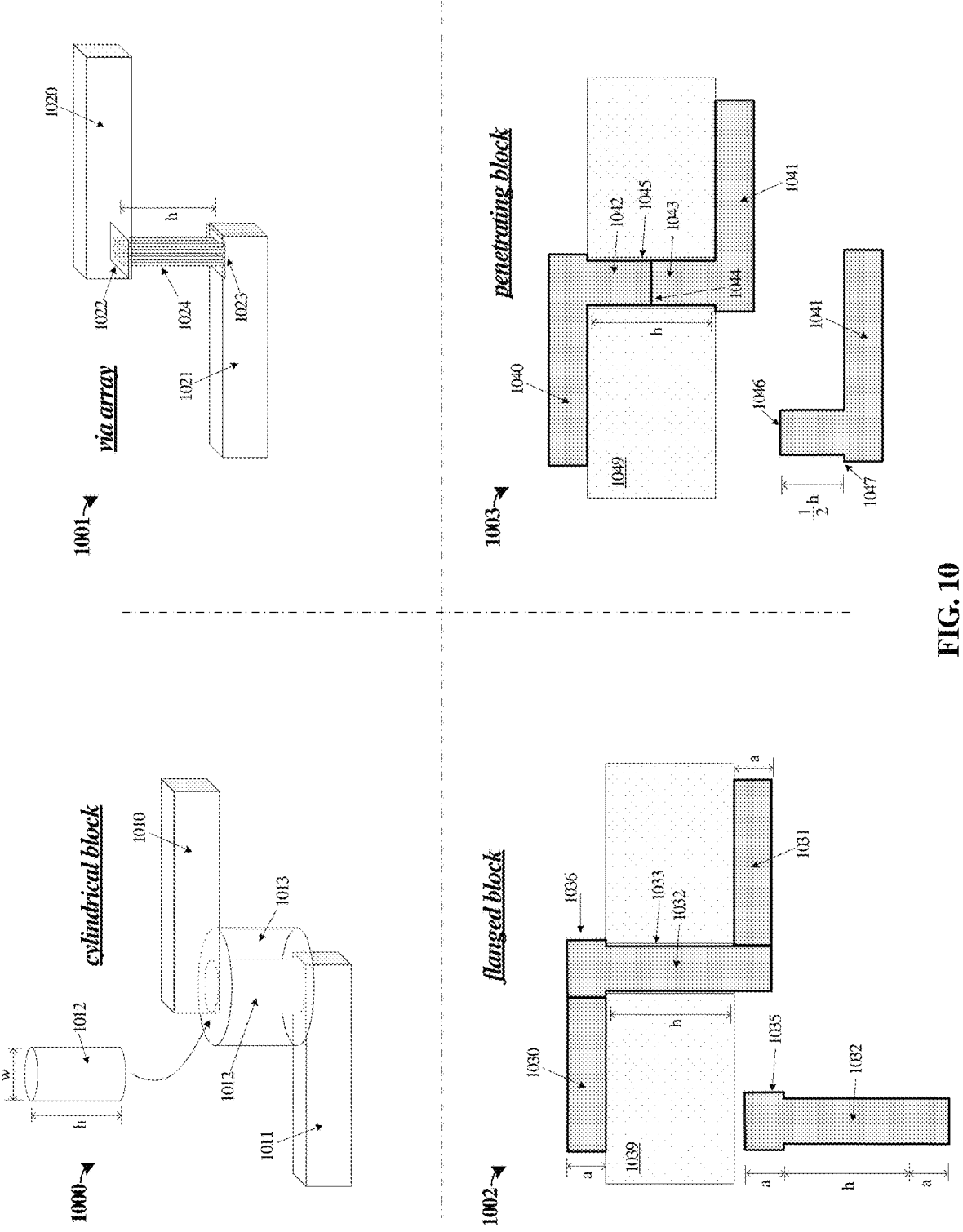
FIG. 10 illustrates through-board conductive modular block examples in an implementation.

In addition to the aforementioned surface routing and inclusion and placement of BLCs, various through-hole configurations can be established for BLCs. These through-hole configurations include high-current pathways from one side of a circuit board to another side, and can typically carry a much larger current than traditional via structures. FIG. 10 below discusses such arrangements in more detail. However, circuit board layout operations can provide placement of blocks in proximity to a through-hole (e.g., based on through-hole diameter and desired current carrying capacity), to provide substantially greater quantity reflowable current-carrying material, as compared to traditional vias and solder paste, which wicks into and fills the through-hole during reflow, increasing the current-carrying capacity of the through-hole. Circuit board layout operations can provide placement of a through-hole posts and corresponding blocks as components, based on capillary action, surface tension, tinning, wetting, or wicking requirements for a selected diameter through-hole. Circuit board layout operations can provide expansion of a diameter of a through-hole post, based on a current-carrying capacity requirement of a through-hole BLC. Circuit board layout operations can provide expansion of an original current-carrying through-hole post into a plurality of proximately spaced through-hole posts, based on a current-carrying capacity requirement of the original through-hole post. Circuit board layout operations can provide placement of a first penetrating block onto a first side of a circuit board, and a second penetrating block onto a second (opposing) side of the circuit board, including selecting an angle for placement of the blocks by a pick-and-place machine, such that both penetrating blocks will extend into the through-hole simultaneously, allowing improved wicking during reflow (if reflow occurs from both sides of board).

Once a circuit board layout has been established, then operation 312 includes generating a manufacturing description for the circuit board layout, which can include the BLC(s). This manufacturing description can comprise various formats or data files which describes various features of the circuit board layout, including descriptions of conductive layers, insulating layers, solder mask features, drill data for vias and through-holes, pick-and-place instructions, BLC selection and placement, and other various manufacturing descriptions. One industry standard for manufacturing description includes the Gerber format which includes plain-text descriptions of the above noted elements, among other elements. Gerber-formatted files include descriptions on a layer-by-layer basis for manufacturing a circuit board (conductive layers, insulating layers, solder mask layers, silk screen printed layers, etc.), as well as various metadata. Separate manufacturing descriptions or files can be generated for describing component netlists, component identification information, and placement descriptions for components to be assembled onto the circuit board.

The manufacturing description can then be employed (operation 313) to direct circuit board manufacturing operations. A circuit board is typically manufactured in layers, with each layer described by the manufacturing description. Alternating layers of conductive material (e.g., traces and planes) and insulating material (e.g., substrate) are formed into a stacked sandwich arrangement which is pressed/glued together to form a printed circuit board (PCB) which may have one or more surface layers etched to have pads or footprints for components and traces coupling among the footprints. BLC elements are included among these footprints and traces. Solder masking material is applied to the PCB which defines exposed metal areas which can receive solder or solder paste during a circuit board assembly process. Also, various labeling can be produced by 'silk screen' layers which include component outlines, component labels, debug/testing information, serial/model numbering, versioning, and other various information.

Once a PCBs has been produced, then it can be assembled into a circuit board/card assembly having populated components. The manufacturing description mentioned above can be used to direct automated assembly of these components onto the PCB, in operation 314. In one example, a pick-and-place machine or robotic placement mechanism is employed to select electrical components for placement onto the PCB and then for actual placement onto the PCB. Typically, a solder paste is first applied to the PCB before components are placed onto the PCB. Solder mask can aid in keeping solder paste material from sticking to masked areas and adhering to unmasked areas (e.g., exposed traces and pads). The exposed pad area helps determine the solder paste volume (in addition to the solder paste stencil thickness). Additional pad area could be used to provide additional solder paste volume in some cases. In FIG. 2, one example assembly process is shown, where conductive modular block 223 is selected for placement onto target location 213 of circuit board 210. Conductive modular blocks 221-222 have already been placed onto circuit board 210 onto pilot traces 211-212. In operational example 201, conductive modular blocks 221-228 have been placed to form two BLCs.

Then, a solder reflow process occurs in operation 315. A solder reflow process includes heating the PCB with placed components to a target temperature such that solder material reflows into a liquid or partial-liquid state and connects pads to component balls, leads, pins, or bumps, among other wettable surfaces. Operation example 202 of FIG. 2 shows two completed BLCs 241-242 formed from individual conductive modular blocks and placed onto pilot traces 211-212. In examples where the conductive modular blocks comprise a substantial portion of reflowable material, then the conductive modular blocks themselves will melt/wick to form a continuous BLC between endpoints, coupling adjacent blocks to each other. In examples where the conductive modular blocks comprise non-reflowable material, then the solder paste employed in operation 314 will melt and fuse the individual blocks together to form a continuous BLC between endpoints.

Insulation of the BLCs can occur using various techniques, some of which are discussed herein. In one example, the conductive modular blocks comprising a BLC can contain an admixture of beads which, when heated during reflow, are expelled to the outer/exterior surfaces of the conductive modular blocks. This expelled material can then solidify, harden, or cure into an insulating (non-conductive) layer about the exterior of the conductive modular blocks. Thus, the insulation technique can include establishing an insulating layer over the modular conductive blocks by at least providing a material configured to remain on or migrate to exterior surfaces of the modular conductive blocks during the solder reflow operation or a secondary reflow operation. The secondary reflow operation might comprise a different temperature or duration of temperature to provide for a reflow of a different material composition than the solder or solder mask material. Conductive beads, strings, scaffolding, skeletons, exoskeletons, or other aggregate materials which do not get expelled to the surface may also be included, such as to increase a structural rigidity of the modular blocks or to alter a conductivity of the modular blocks. An aggregate filler material, such as metal beads, can also be included internal to a block to reduce cost and/or modify reflow properties. Such a block would still be considered a reflowable block, but include a quantity of less expensive or lighter weight aggregate fill material.

In other examples, additional insulating components can be applied according to the manufacturing description, such as during a pick-and-place operation to fit onto pads or footprints manufactured onto the circuit board. Insulating caps can be applied along the route which cover the modular conductive blocks and attach to the circuit board. The modular conductive blocks might comprise a non-conductive shell on one or more exposed sides, where a non-conductive shell retains rigidity during reflow, and is non-conductive after reflow. In other examples, the modular conductive blocks comprise a chemical composition or additive which forms an oxidative or non-conductive outer surface during/after reflow. This chemical composition or additive might form a non-conductive outer layer on the modular conductive blocks during the reflow process, resultant from the reflow process, or from a post-reflow process including ultraviolet (UV) light exposure/curing or post-reflow material exposure and curing/processing.

Figure 4:
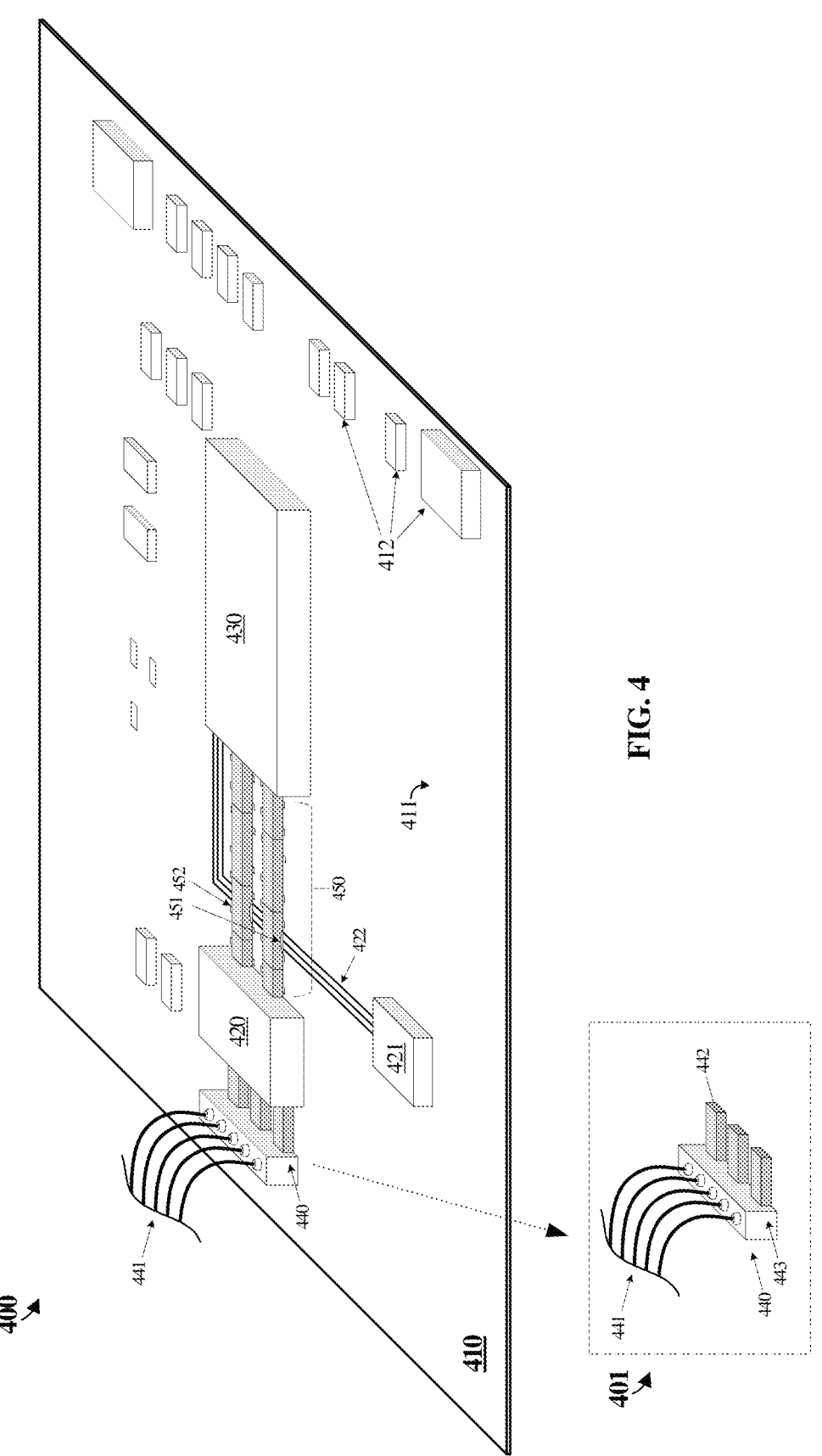
FIG. 4 illustrates a circuit board assembly in an implementation.

FIG. 4 includes a further example of an assembled circuit board having BLC components applied thereto. FIG. 4 includes circuit board assembly 410. View 400 is an isometric view of circuit board assembly 410, and detailed inset view 401 includes connector assembly 440 with integrated BLC elements.

Turning first to circuit board assembly 410, included on motherboard 411 are voltage conversion system 420 and system-on-a-chip (SoC) 430 which are coupled over BLCs 450. BLCs 450 include two parallel links configured to carry electrical current from voltage conversion system 420 and SoC 430. Electrical power is supplied to voltage conversion system 420 of motherboard 411 over cable 441 to connector assembly 440. Also included on circuit board assembly 410 are various other integrated circuits and passive components. For example, integrated circuit 421 is included as an example integrated circuit which couples to traditional traces on motherboard 411. Also, various passive components 412 are included as examples of additional components mounted to motherboard 411. This simplified view of motherboard 411 focuses on voltage conversion system 420, SoC 430, connector assembly 440, and BLCs 450. Thus, it should be understood that various other components, interconnect, traces, features, and elements can be included but are omitted for clarity.

BLCs 450 each include two parallel sets of conductive modular blocks. Among the blocks are two 'bridge' blocks 451-452 which span over underlying traces 422 that couple integrated circuit 421 to SoC 430. Bridge blocks 451-452 comprise a bottom element or shell that restricts or prevents wicking of reflowable material to motherboard 411 underneath the bridge. This configuration allows underlying traces 422 to be isolated from bridge blocks 451-452 to provide an extra surface layer of PCB routing.

View 401 of FIG. 1 illustrates one example technique to couple BLC style of conductors to connectors, such as those used for coupling to cables, external devices, or other non-surface mount elements. Connector assembly 440 includes BLC terminations 442 and connector body 443 which couples and holds terminal ends of wires in cable 441. BLC terminations 442 comprise similar conductive body members as found for conductive modular blocks of BLCs 450. As such, BLC terminations 442 can comprise a substantial portion of reflowable material, such as solder material, or non-reflowable material having end portions which couple to adjacent blocks during a reflow process. In this manner, off-board connectors can be coupled into BLC structures.

Figure 5:
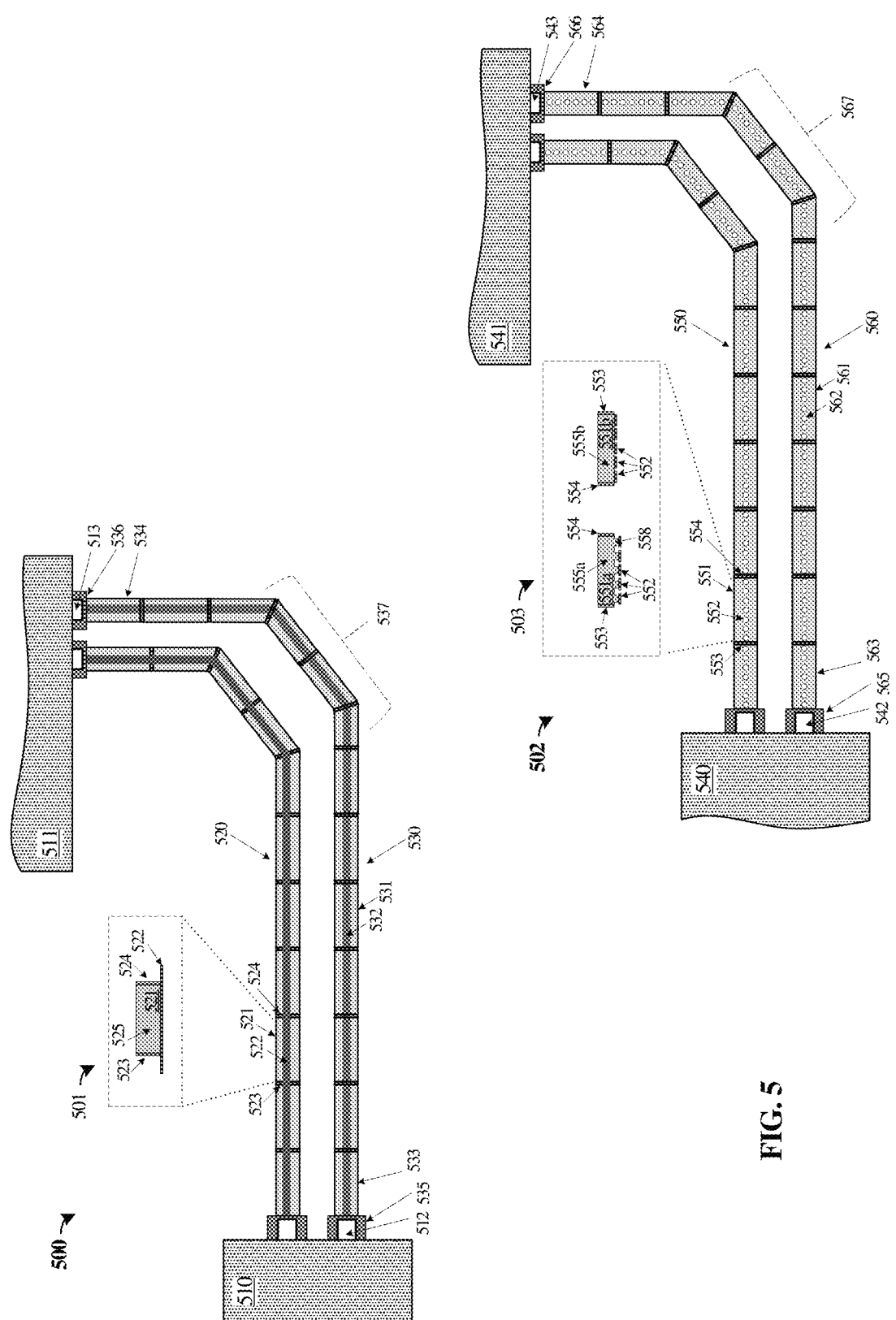
FIG. 5 illustrates circuit board routing examples in an implementation.

FIG. 5 illustrates circuit board BLC routing examples in an implementation, with example routes defined using pilot traces (522 and 532) in view 500 and routes of disconnected footprint pads (552 and 562) in view 502. Additionally, FIG. 5 illustrates bends or curves in routed pathways for BLCs between endpoint components.

Turning first to view 500, BLCs 520 and 530 each span between component 510 and component 511, forming conductive links for carrying higher currents than surface mount traces of a circuit board. In view 500, pilot traces 522 and 532 are used to define routes between component 510 and component 511, and a sequence of conductive modular blocks are placed onto solder paste applied to these pilot traces. A reflow process then conductively couples the conductive modular blocks of each BLC to each other and to the corresponding pilot traces. Additionally, angled conductive modular blocks are employed during bend 537 along the routes. These angled blocks include different lengths and geometries to fit the bend/turn radii of each BLC and form a continuous conductor by coupling to straight sections of the BLCs. Example angles include any angle from 0-90°, and may include common angles such as 90° and 45°. In some configurations, the arrangement or geometry of the blocks is selected to prevent joints from bisecting angled sections, and solid blocks can form angles/corners to ensure all joints are perpendicular or similar in configuration. Alternatively, curved sections can be employed instead of angled portions. Pick-and-place configurations include picking and placement of these specifically sized and shaped blocks suitable to form bend 537. Angled end portions of each of the blocks that form bend 537 facilitate the angle and interconnection of the blocks during reflow operations.

View 500 illustrates BLC termination features at each of component 510 and component 511, and are discussed for BLC 530. Similar features are included for BLC 520. These BLC termination features include terminal blocks 533 and 534 which couple to component pads 535 and 536, respectively. Component terminals or pins 512 and 513 are representative of any suitable connection terminal for an electronic device or electrical component-such as pads, pins, balls, bumps, or other styles of terminal. Terminal blocks 533 and 534 thus include interface features to couple from the corresponding BLC to component pads. When terminal blocks 533 and 534 comprise reflowable material, the material itself can reflow over component pads 535 and 536 to form a tapered connection by way of melt and surface tension defined by the associated solder mask boundaries. This configuration may include clearance for the taper to reach the component pads, especially of the pads couple to component terminals underneath the component. When terminal blocks 533 and 534 comprise non-reflowable material, various integrated tapered shapes can be formed into the terminal blocks to form a conductively tapered interface, or a reflowable end portion can be included on terminal ends of terminal blocks 533 and 534 to operate similar to the reflowable blocks. Short break-out traces can also be employed to couple the BLC to components or planes, even if a cross-sectional reduction is encountered along with accompanying voltage drop or joule heating. Other configurations are possible, including through-hole connections to under-device terminals.

Also included in FIG. 5 is view 501 illustrating a side view of conductive modular block 521 mounted onto pilot trace 522. Conductive modular block 521 includes conductive body member 525 and end portions 523-524. As discussed herein, conductive body member 525 can comprise a reflowable material, such as a solder material, or instead comprise a non-reflowable material such as a piece of conductive metal between end portions 523-524. End portions 523-524 are wettable during a reflow process to draw solder between individual blocks and form a continuous conductor. End portions 523-524 may also contain reflowable material.

Turning now to view 502, BLCs 550 and 560 each span between component 540 and component 541, forming conductive links for carrying higher currents than surface mount traces of a circuit board. In view 502, footprint patterns 552 and 563 are used to define routes between component 540 and component 541, and a sequence of conductive modular blocks are placed onto solder paste applied to these footprint patterns. A reflow process then conductively couples the conductive modular blocks of each BLC to each other and to the corresponding footprint patterns. Additionally, angled conductive modular blocks are employed during bend 567 along the routes. These angled blocks include different lengths and geometries to fit the bend/turn radii of each BLC and form a continuous conductor by coupling to straight sections of the BLCs. Pick-and-place configurations include picking and placement of these specifically sized and shaped blocks suitable to form bend 567. Angled end portions of each of the blocks that form bend 567 facilitate the angle and interconnection of the blocks during reflow operations.

View 502 illustrates BLC termination features at each of component 540 and component 541, and are discussed for BLC 560. Similar features are included for BLC 550. These BLC termination features include terminal blocks 563 and 564 which couple to component pads 565 and 566, respectively. Component terminals or pins 542 and 543 are representative of any suitable connection terminal for an electronic device or electrical component-such as pads, pins, balls, bumps, or other styles of terminal. Terminal blocks 563 and 564 thus include interface features to couple from the corresponding BLC to component pads. When terminal blocks 563 and 564 comprise reflowable material, the material itself can reflow over component pads 565 and 566 to form a tapered or fillet connection by way of melt and surface tension defined by the associated solder mask boundaries. This configuration may include clearance for the taper to reach the component pads, for example where the pads couple to component terminals underneath the component. If there is a wettable skeleton or aggregate filler material included in terminal blocks 563 or 564, this can also help bridge gaps. When terminal blocks 563 and 564 comprise non-reflowable material, various integrated tapered shapes can be formed into the terminal blocks to form a conductively tapered interface, or a reflowable end portion can be included on terminal ends of terminal blocks 563 and 564 to operate similar to the reflowable blocks. Other configurations are possible, including through-hole connections to under-device terminals.

Also included is view 503 illustrating a side view of two example implementations of conductive modular block 551 mounted onto footprint pattern 552. Conductive modular block 551*a* includes conductive body member 555*a* having protrusions 558. Conductive modular block 551*b* includes conductive body member 555*b* without protrusions. Protrusions 558 can include small fingers of conductive material which contact individual pads among footprint pattern 552. Protrusions 558 can comprise reflowable material or non-reflowable material, and are used to position conductive modular block 551*a* onto footprint pattern 552. Protrusions 558 can comprise a different type of material than body member 555*a*, such as a reflowable material when body member 555*a* is non-reflowable. Conductive modular block 551*a* and 551*b* both have similar end portions 553-554. As discussed herein, conductive body members 551*a*/551*b* can comprise a reflowable material, such as a solder material (with or without a scaffold or internal aggregate), or instead comprise a non-reflowable material such as a piece of conductive metal between end portions 553-554. End portions 553-554 are wettable during a reflow process to draw solder between individual blocks and form a continuous conductor.

Figure 6:
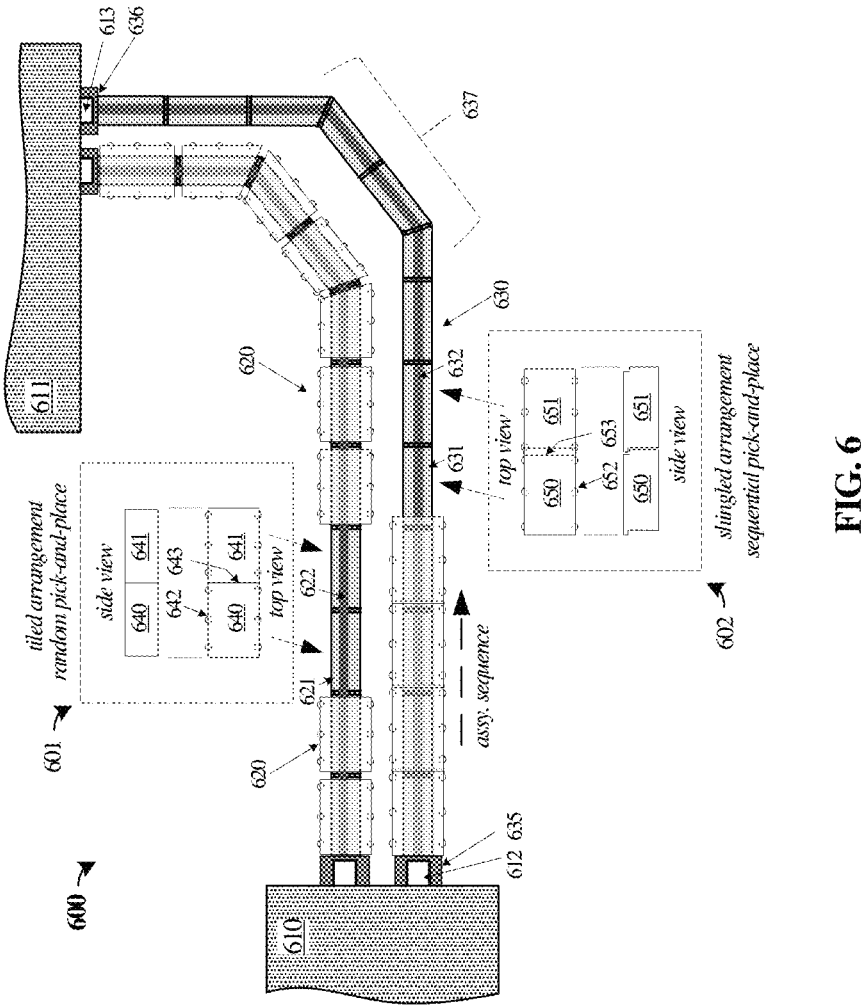
FIG. 6 illustrates insulation cap examples in an implementation.

FIG. 6 illustrates examples of insulation caps which can be applied over BLCs in an implementation. The examples in FIG. 6 include BLCs mounted to a circuit board, with insulation caps applied thereto. Additionally, FIG. 6 illustrates bends or curves in routed pathways for BLCs between endpoint components. Insulation caps can comprise one example technique to electrically insulate or physically isolate BLCs from surrounding components and environments. Optionally, the insulating caps may be optically transparent, have optical perforations, or have periodic gaps to allow for optical inspection of the BLC conductive blocks and associated joints. Other techniques are discussed herein, such as coatings, varnishes, reflowable materials, and the like. Also, two example varieties of insulation caps are shown in FIG. 6, namely a non-overlapping type employed for BLC 620 (with detailed views 601), and an overlapping type employed for BLC 630 (with detailed views 602). Example materials for these insulation caps include any non-conductive material, such as polymer, glass, or ceramic, including example materials such as polyamide (e.g., Kapton), nylon, acrylic, acrylonitrile butadiene styrene (ABS), vinyl, heat-shrink materials, and others.

In view 600, BLCs 620 and 630 each span between component 610 and component 611, forming conductive links for carrying higher currents than surface mount traces of a circuit board. Pilot traces 622 and 632 are used to define routes between component 610 and component 611, and a sequence of conductive modular blocks are placed onto solder paste applied to these pilot traces. A reflow process then conductively couples the conductive modular blocks of each BLC to each other and to the corresponding pilot traces. Additionally, angled conductive modular blocks are employed during bend 637 along the routes. These angled blocks include different lengths and geometries to fit the bend/turn radii of each BLC and form a continuous conductor by coupling to straight sections of the BLCs. Pick-and-place configurations include picking and placement of these specifically sized and shaped blocks suitable to form bend 637. Angled end portions of each of the blocks that form bend 637 facilitate the angle and interconnection of the blocks during reflow operations. View 600 also illustrates BLC termination features at each of component 610 and component 611, and are labeled on BLC 630. These termination features include termination blocks which couple to component pads 635 and 636 and component terminals 612 and 613. Similar configurations are found in FIG. 5 above, and a further discussion is omitted for FIG. 6 for brevity.

FIG. 6 shows two insulating cap arrangements, a tiled or abutted arrangement for BLC 620, and an overlapping or shingled arrangement for BLC 630. Also included in FIG. 6 are views 601 and 602 illustrating top views and side views of example insulation cap arrangements. In view 601, a tiled arrangement is shown having example caps 640-641 abutted at end portions 643. In this tiled arrangement, a random pick-and-place process can be employed to place caps in any order onto/over BLC 620. In view 602, an overlapping shingled arrangement is shown having example caps 650-651 overlapping at end portions 653. In this shingled arrangement, a pick-and-place process can be employed to place caps in a selected order onto/over BLC 630 to provide the shingled/overlap configuration. To fasten insulating caps onto the corresponding circuit board or BLC, various pads or footprints can be employed, such as shown for pads 642 and 652 which couple to corresponding pins or contacts of the insulating caps. Solder mask can be applied to these pads and a reflow process can adhere insulating caps to the circuit board. Other configurations are possible, such as clips, friction-fit features, adhesives, fasteners, or direct coupling to BLCs 620 and 630 using solder/reflow, adhesive, tacks/pins/spikes, or other elements.

Figure 7:
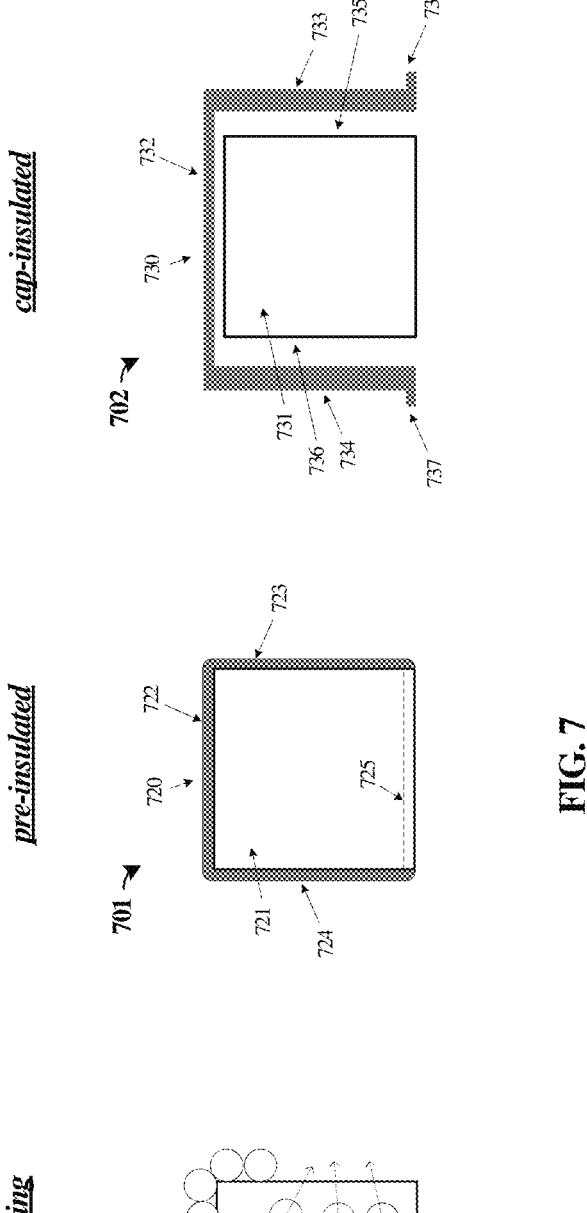
FIG. 7 illustrates insulation examples in an implementation.

FIG. 7 illustrates insulation examples for BLCs in an implementation. View 700 illustrates a self-insulating example, view 701 illustrates a pre-insulated example, and view 702 illustrates a cap-insulated example.

View 700 includes an end view of self-insulating conductive modular block 710 having conductor body 711. Conductor body 711 comprises a substantial portion of reflowable material, such as a solder material. Embedded within this material are particles, chunks, or beads 712 which migrate to exterior surfaces of conductor body 711 during a reflow process. Beads 712 might remain solid during the reflow process and have a surface property, buoyancy property, or immiscibility property that provides for migration of beads 712 to an exterior surface of conductor body 711 when reflowed. Beads 712 can comprise an admixture which, when heated, is expelled to the outer surface of conductor body 711 and set to a solid insulation layer upon cooling and/or curing. Beads 712 can comprise a non-polarizable material that may be expelled to the surface of body 711, or a selected type of plastic beads which are non-polarizable/non-wettable by solder. Mixing flux into the mixture may help a separation of beads from reflowable material occur. A heavy/thick flux may itself act as an insulating layer which is expelled from the solder block. The flux or other immiscible elements might be substantially spherical or ovoid beads, or alternatively a solid core, solid shell, mesh, or other pattern/shape that melts and distributes on the outside of body 711. Thus, beads 712 establish a surface insulating layer over modular conductive block 710 by at least providing a material configured to remain on or migrate to exterior surfaces of modular conductive block 710 during the solder reflow operation or a secondary reflow operation. The secondary reflow operation might occur to melt or merge beads 712 into a continuous surface once beads 712 have migrated to the surface of modular conductive block 710. A curing process may be employed, either in combination with or separately from a secondary reflow operation. The beads may have insulating properties, one or more of the reflow operations may contribute to the insulating properties of the bead material, the curing process may contribute to the insulating properties of the bead material, or any combination thereof. This curing process can include exposure to UV light, a reactant chemical or wash, or exposure to an oxidant or other similar material, including combinations thereof.

View 701 includes an end view of pre-insulated conductive modular block 720 having conductor body 721. Conductor body 721 might comprise a substantial portion of reflowable material, such as a solder material, or might instead comprise a non-reflowable material. In this example, insulating coatings are applied prior to a reflow process, or even prior to a pick-and-place operation, which coat at least some exterior surfaces of conductor body 721. This insulating coating includes top portion 722, first side portion 732, second side portion 724, and optional bottom portion 725 (e.g., for 'bridge' block arrangements), and can form a non-conductive shell over conductive modular block 720. In some examples, the insulating coating remains solid or rigid during a solder reflow process that fuses/couples individual blocks into a BLC, whereby adjacent blocks reflow and fuse together while their non-conductive shells remain in place. This can then form a rigid protective outer barrier. There may be gaps between the rigid non-conductive shells, but they are held in place by the soldered blocks underneath.

Finally, view 702 includes an end view of cap-insulated conductive modular block 730 having conductor body 731. View 702 can be an example of the cap-based insulation techniques and elements found in FIG. 6. Insulating cap 732 can be applied onto or over conductive modular block 730 during a pick-and-place operation, but after placement of conductive modular block 730. A tiled or shingled arrangement can be employed for insulating caps among adjacent conductive modular blocks. Also shown in view 702, cap sides protrude from a top of cap 732 to protect sides of conductive modular block 730. Insulating gaps 735-736 might also be included or omitted, depending on the application and desired insulation and manufacturing requirements. Attachment points 737 can be employed to attach, such as with solder or clips, insulating cap 732 to a circuit board. Conductor body 731 can be attached to a circuit board prior to and separately from insulating cap 732. In other examples, conductor body 732 and insulating cap 732 can form a pre-attached assembly which is then applied to the circuit board.

Figure 8:
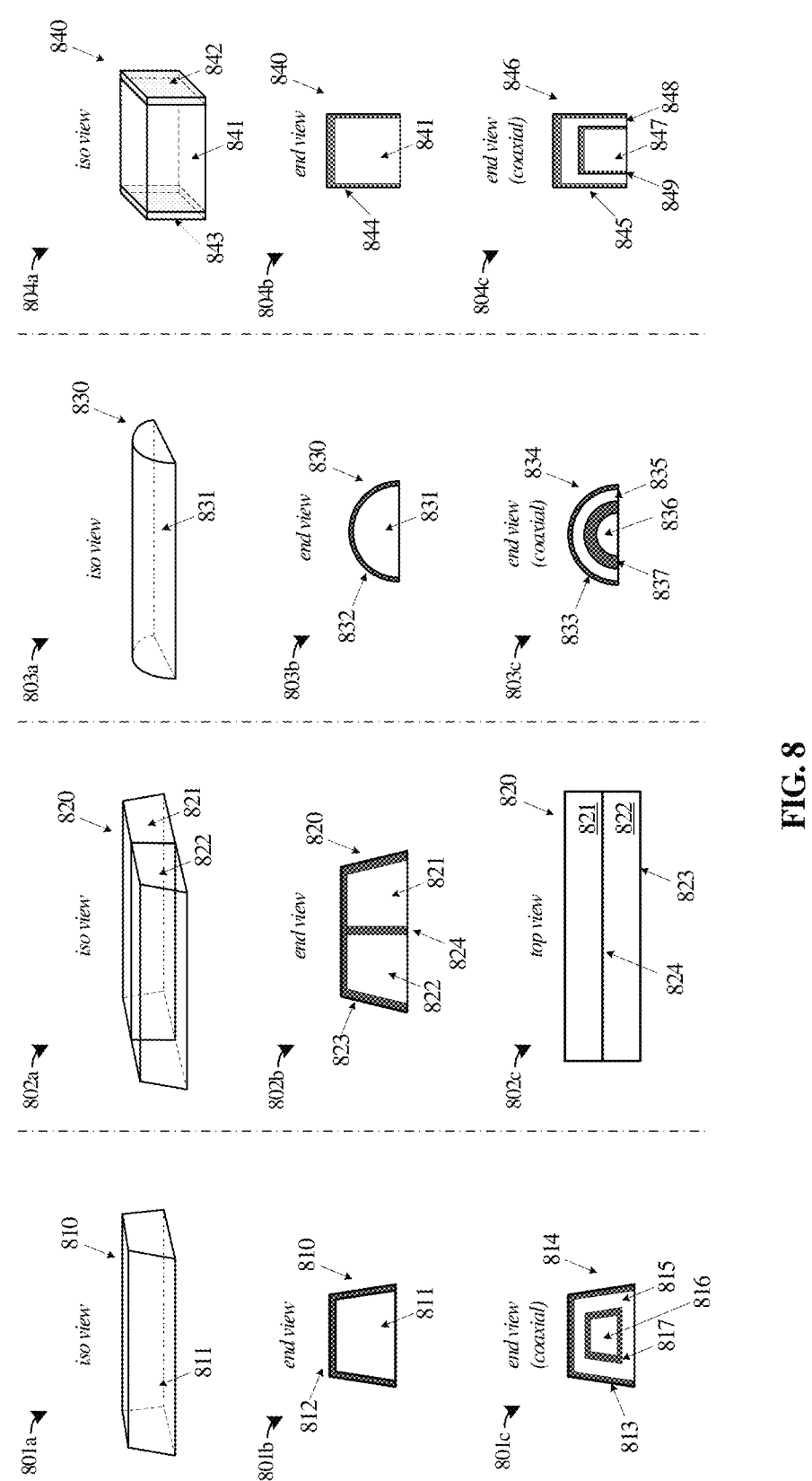
FIG. 8 illustrates conductive modular block examples in an implementation.

FIG. 8 illustrates conductive modular block examples in an implementation. Specifically, FIG. 8 includes trapezoidal block configuration 801, double-trapezoidal block configuration 802, half-round block configuration 803, and rectangular block configuration 804. Other configurations are possible, and the examples in FIG. 8 merely illustrate an exemplary subset of the potential shapes, geometries, profiles, and configurations of conductive modular blocks. For example, attachment of the blocks to a circuit board can provide structural rigidity to the circuit board itself, and geometries or cross-sectional shapes can be selected to enhance this operation. In one instance, T-shaped blocks might provide additional structural rigidity to a circuit board when applied with the flange of the 'T' abutting the circuit board. Other circuit board structurally-enhancing shapes or geometries can be considered. Also, although generally smooth-sided block configurations are shown, various protrusions can be included to attach blocks to a circuit board. These protrusions can contact pads, or penetrate a circuit board (through-holes) to clip or friction fit blocks onto a circuit board for mechanical stability, vibration resistance, thermal stability, and temporary attachment to withstand pick-and-place and reflow operations on an underside of a circuit board. Voids or hollow central portions of the blocks can be included to reduce mass/weight of each block, which can also be helpful for adhesion of underside-mounted BLC components during reflow operations.

Each conductive modular block includes a bulk material which can comprise reflowable material (or a substantial amount of reflowable material), such as various compounds of solder. Example compounds include Sn—Pb, Sn—Ag—Cu, Sn—Ag, Sn—Cu, Sn—Ag—Cu—Zn, Sn—Ag—Cu—Mn, among other compounds. Alternatively, this bulk material can comprise a non-reflowable solid or stranded material, such as copper, aluminum, gold, silver, and other materials, including combinations thereof.

Turning first to trapezoidal block configuration 801, view 801a illustrates block 810 which includes block body 811 arranged as a bulk material along a longitudinal axis. View 801b shows an end view of block 810 with an optional insulating material 812 applied to exterior surfaces of block body 811. Insulating material 812 can comprise a coating or surface treatment which electrically isolates block body 811 from surrounding materials and components. View 801c also shows an end view, but of a slightly different configuration that comprises a coaxial arrangement for block 814. Inner conductor 816 is surrounded by insulator material 817, which is further surrounded by outer conductor 815 and insulating material 813. This coaxial arrangement can be employed to carry two different voltages or carry a voltage along with its reference potential or ground.

Turning next to double-trapezoidal block configuration 802, view 802a illustrates block 820. Block 820 includes dual block bodies 821-822 arranged as side-by-side bulk materials forming two parallel conductors along a longitudinal axis. Additional parallel conductors might be included. View 802b shows an end view of block 820 with an optional insulating material 823 and 824 applied to exterior surfaces (823) and conductor interfacing surface (824) of block bodies 821-822. This insulating material can comprise a coating or surface treatment which electrically isolates block bodies 821-822 from surrounding materials and components, as well as among each conductor included in block 820. View 802c shows a top view of block 820. This parallel conductor arrangement can be employed to carry two different voltages or carry a voltage along with its reference potential or ground.

For half-round block configuration 803, view 803a illustrates block 830 which includes block body 831 arranged as a bulk material along a longitudinal axis. View 803b shows an end view of block 830 with an optional insulating material 832 applied to exterior surfaces of block body 831. Insulating material 832 can comprise a coating or surface treatment which electrically isolates block body 831 from surrounding materials and components. View 803c also shows an end view, but of a slightly different configuration that comprises a coaxial arrangement for block 834. Inner conductor 836 is surrounded by insulator material 837, which is further surrounded by outer conductor 835 and insulating material 833. This coaxial arrangement can be employed to carry two different voltages or carry a voltage along with its reference potential or ground.

For rectangular block configuration 804, view 804a illustrates block 840 which includes block body 841 arranged as a bulk material along a longitudinal axis. Optional end terminals or end portions 842-843 are included in view 804a. End portions 842-843 can comprise capping materials suitable for reflow or soldering to corresponding footprints, such as solder-wettable materials, solder, or other reflow-compatible material. End portions 842-843 might be employed when the bulk material of block body 841 comprises non-reflowable material, such as a solid metal member. View 804b shows an end view of block 840 with an optional insulating material 842 applied to exterior surfaces of block body 841. Insulating material 842 can comprise a coating or surface treatment which electrically isolates block body 841 from surrounding materials and components. View 804c also shows an end view, but of a slightly different configuration that comprises a coaxial arrangement for block 846. Inner conductor 847 is surrounded by insulator material 849, which is further surrounded by outer conductor 848 and insulating material 845. This coaxial arrangement can be employed to carry two different voltages or carry a voltage along with its reference potential or ground.

Figure 9:
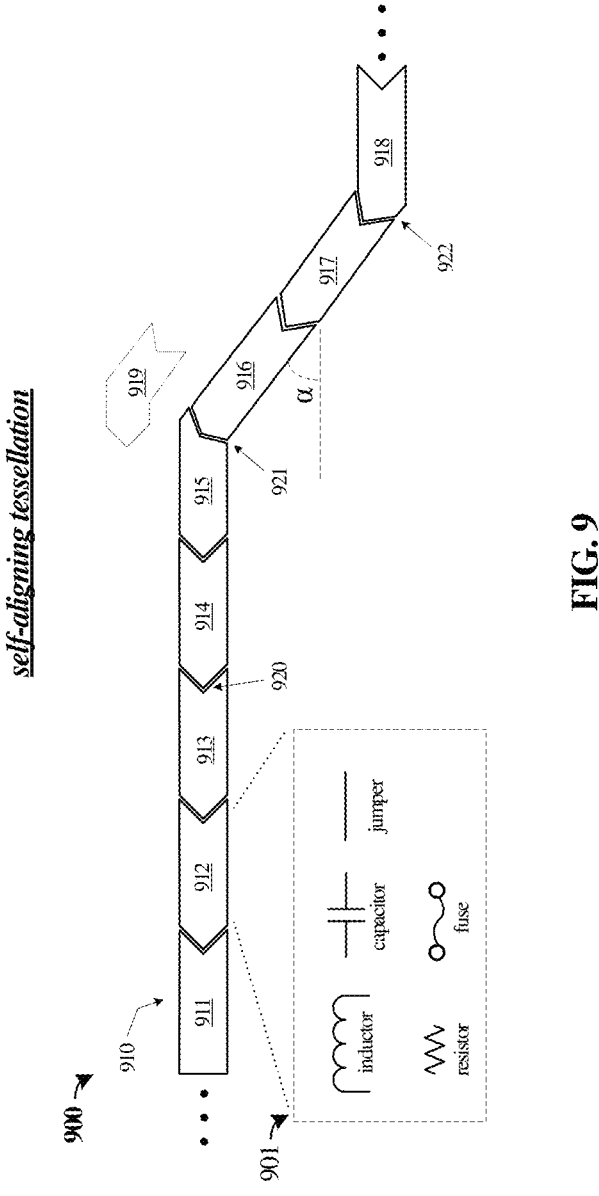
FIG. 9 illustrates conductive modular block examples in an implementation.

FIG. 9 illustrates additional conductive modular block examples in an implementation, specifically, tessellation features for end portions of conductive modular blocks. As discussed in FIG. 9, interface geometries of the conductive modular blocks may also be such that they tesselate or interlock with each other to increase the interconnecting surface area and improve solder wicking action. Tessellation or other types of overlapping features among blocks can be included to tessellate/overlap on different surfaces or axes, such as on vertical joints between blocks (i.e., perpendicular to the circuit board surface) or horizontal joints between blocks (i.e., parallel to the circuit board surface.

Conductive modular blocks 911-918 form BLC 910 which includes two bends 921 and 922 for achieving angle α within BLC 910. Individual blocks among BLC 910 include angled tessellations (e.g., 920) which may interlock. During a reflow operation, increased contact surface area among the blocks provides for more wetting surface area for solder, as well as for self-assembly and self-alignment when the solder is in a flowable state. In this manner, more complex routes and shapes of BLCs can be provided which do not self-migrate off of a pilot trace or sequence of footprints that define the route. Moreover, certain tessellations or interlocking end features can provide for 'routeless' BLCs which lack a pilot trace or series of footprints, and individual blocks couple to each other during the reflow operation without adherence to a circuit board. When temperatures in relation to curie temperatures are not achieved during reflow operations, magnetic attachments can be included to couple blocks to each other. Also, optional corner/angled block 919 shows an alternate configuration where a tessellation joint is not located at a corner, and instead is configured to be at straight segments of a BLC.

Also shown in FIG. 9 are different compositions of modular blocks. Although conductive blocks have been discussed herein, mainly comprising a conductive material to minimize resistive or inductive losses along a conduit, other electrical components might be integrated inline with such conductor blocks. In view 901 an assortment of example electrical components can be employed, such as resistors, inductors, capacitors, fuses, noise/EMI filters, low-pass filters, high-pass filters, rectifiers, diodes, overvoltage protection elements, and other components, with additional ground terminals required in some instances. A 'jumper' might represent a baseline conductor block for schematic purposes. In this manner, a resistor might be placed inline for current sensing capability along a BLC, or inductors or capacitors can be included for EMI reduction, filtering, or energy storage, among other uses. While passive components are shown in FIG. 9, it should be understood that various active or integrated components can also be included, such as electronic integrated devices which piggyback or mount onto a surface of a block.

FIG. 10 illustrates through-board conductive modular block examples in an implementation. Through-board connections allow coupling of BLCs from a first surface to a second surface of a circuit board. Several configurations of through-board connections are shown in views 1001-1003 of FIG. 10. The actual circuit board is omitted in view 1000 and 1001 for clarity, but a circuit board will typically be included between opposing conductive blocks. Since some examples include block components applied to both sides of a circuit board, various features can be included to prevent fall-off of circuit board 'underside' block components during reflow operations. These features can include temporary or permanent clips, tapes, or adhesives. These features can also include adding lighter mass blocks (i.e., hollow blocks) to undersides, or installing insulating caps before reflow operations to act as clips for the blocks themselves.

In view 1000, two conductive modular blocks 1010-1011 are positioned on opposing sides or surfaces of a circuit board (not shown). A through-hole has previously been drilled or etched through the circuit board, such as shown for hole 1013. Hole 1013 can comprise a drilled and plated through-hole in the corresponding circuit board. Block 1012 having height 'h' and width 'w' is inserted into hole 1013 during a pick-and-place operation and can be held in place by friction, solder paste, or a sabot or similar carrier. Then, conductive modular blocks 1010-1011 are placed such that they both contact opposing ends of block 1012. During a reflow operation, solder can be drawn into the hole and into the interface surfaces between conductive modular blocks 1010, 1011, and block 1012. Block 1012 can comprise a non-reflowable material or instead may comprise a substantial portion of reflowable material which reflows and connects modular blocks 1010-1011, forming a through-hole BLC segment. In reflowable examples, these blocks/segments may be placed as a block of reflowable material adjacent to hole 1013, and get drawn/wicked into hole 1013 during reflow operations. Although shown as a solid cylinder for illustrative purposes, block 1012 may be hollow, or may comprise mesh, grooves, one or more independent columns, variously shaped cross-sectional configurations, or other geometries to improve wicking of reflowable material or reflow of block 1012 itself. The shape, geometry, or configuration can be selected to ensure adequate current carrying capability post-reflow.

In view 1001, a series or plurality of vias is established in the circuit board, forming via array 1024 between pads 1022 and 1023. The quantity and diameter of the vias comprising via array 1024 and having height 'h' can be selected to have a similar conductive property or current carrying capability as conductive blocks 1020-1021. Conductive blocks 1020-1021 are pick-and-placed onto the circuit board (and associated solder paste), and are reflowed to couple to pads 1022 and 1023 and to other conductive blocks (not shown).

In view 1002, a flanged block arrangement is shown. A generally cylindrical block 1032 (similar to that of block 1012) includes flange 1035. Block 1032 has overall height h+2a, and the flange includes a width larger than the main body of block 1032. In this example, block 1032 typically comprises a non-reflowable material, and solder paste can be applied to longitudinal ends of block 1032. During circuit board assembly, block 1032 can be placed into through-hole 1033 drilled in circuit board 1039, and block 1032 is prevented from slipping entirely through hold 1033 by flange 1035 contacting the circuit board. Then, conductive blocks 1030-1031 are applied to the circuit board, and a reflow process can then conductively couple conductive blocks 1030-1031 to block 1032, forming a through-hole BLC segment. In an alternative example, block 1032 might have an overall height h such as seen in view 1001, or include different catching features to prevent slippage out of through-hole 1033 during a reflow process.

In view 1003, a penetrating block arrangement is shown. Conductive blocks 1040-1041 include penetrating portions 1042 and 1043, respectively, which can penetrate a portion of the depth into through hold 1045 drilled in circuit board 1049. Flange 1047 can optionally be included where the conductive block has the penetrating portion to establish a desired penetration depth. Thus, conductive blocks 1040-1041 in at least some examples include penetrating portions with a cumulative depth of approximately h. In some examples, each penetrating portion has a depth sufficient to reach at least halfway (e.g., ½ h), but no more than level with an opposing side of circuit board 1049. In one example, both conductive blocks 1040-1041 include penetrating portions. In another example, only one of conductive blocks 1040-1041 includes a penetrating portion that reaches the full depth of circuit board 1049 (e.g., height 'h'). In another example, both conductive blocks include penetrating portions which substantially reach the full depth of the circuit board (e.g., approximately height 'h'), and the two penetrating portions mate to substantially fill the through-hole. For example, the two penetrating portions may both be full-height, half-cylinders, which also provides for alignment between a top and bottom of a BLC through-board route. As another example, one penetrating portion may include a hollow cylinder, while the other penetrating portion may include a corresponding cylinder which fits within the hollow cylinder. This is an example configuration that provides cross-layer alignment of the penetrating portions, without mandating relative continued direction of the BLC across layers. For non-reflowable compositions of conductive blocks 1040-1041, solder paste can be applied to contacting ends 1046 to provide for conductive coupling during reflow operations, or the blocks can include reflowable solder elements to provide additional solder volume. For reflowable compositions of conductive blocks 1040-1041, self-connection can occur during reflow operations, as the penetrating portions of conductive blocks 1040-1041 will reflow and couple.

Figure 11:
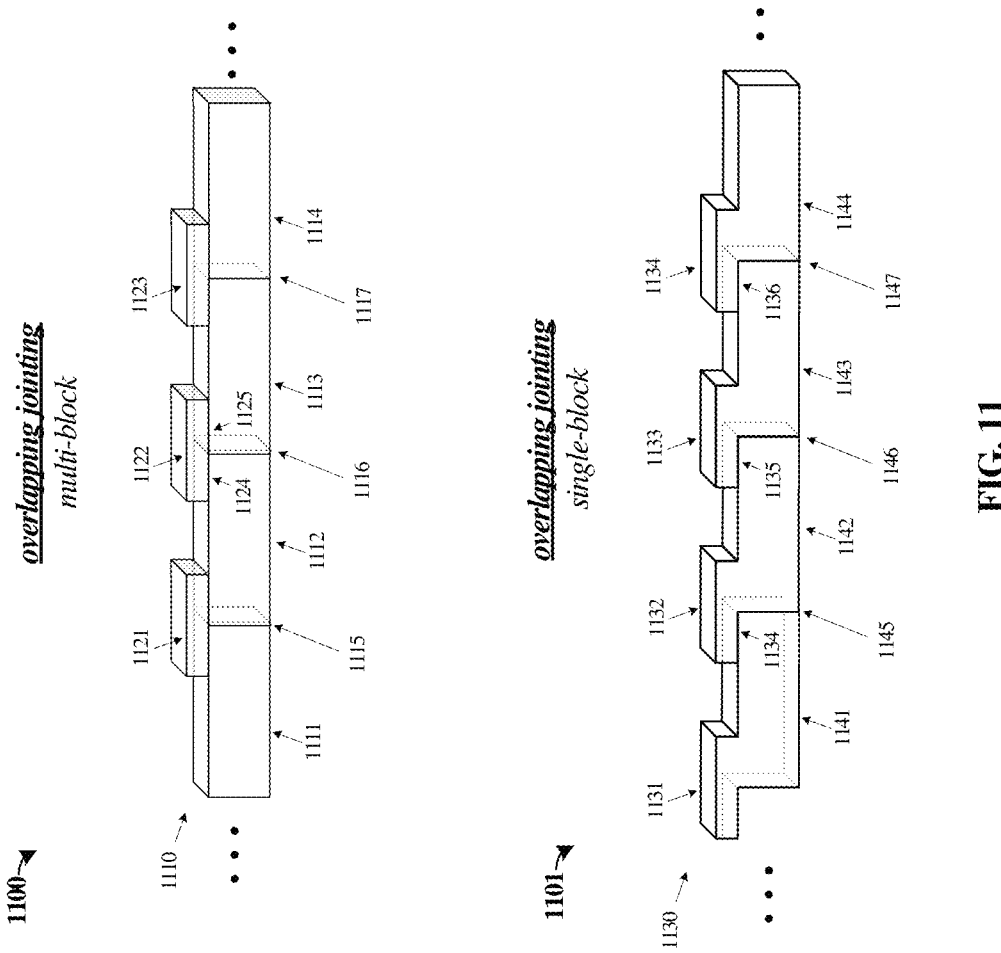
FIG. 11 illustrates conductive modular block examples in an implementation.

FIG. 11 illustrates conductive modular block examples in an implementation. View 1100 illustrates BLC 1110 which is formed from a plurality of conductive modular blocks 1111-1114 with overlapping jointing elements, although a different number of blocks/joints can be included. Conductive modular blocks 1111-1114 can include any of the various types of conductive modular blocks discussed herein, and generally cuboid types are included in view 1100 for clarity. Alternatively, conductive modular blocks 1111-1114 may be made of layered circuit board material or a layered stackup material with conductive traces/planes (similar to materials of the various circuit boards discussed herein) rather than substantially out of a conductive material without underlying carrier substrates. During operation, current can flow through BLC 1110 by taking a route which passes through conductively coupled portions of individual blocks and joint elements.

Joint elements 1121-1123 are included and layered over block joints 1115-1117 between conductive modular blocks 1111-1114. In this example, conductive modular blocks 1111-1114 and joint elements 1121-1123 together form a BLC. Advantageously, block joints 1115-1117 can omit solder or reflowable material in the vertical portions of the joints, or any included vertical solder joints can be less sensitive to solder reflow/wicking/wetting. This can provide case in manufacturing and include solder application only on horizontal surfaces or joints, such as shown for horizontal joints 1124-1125 between conductive modular blocks and joint elements.

Joint elements 1121-1123 can comprise similar materials and types as discussed herein for the various conductive modular blocks, among other implementations. However, a thickness or geometry of joint elements 1121-1123 can vary from that of the blocks based on application or current carrying capability. Joint elements 1121-1123 might comprise a substantial portion of reflowable material, with or without internal scaffolding elements, or may instead comprise generally solid body members. Alternatively, joint elements 1121-1123 may be made of layered circuit board material or a layered stackup material with conductive traces/planes (similar to materials of the various circuit boards discussed herein) rather than substantially out of a conductive material without underlying carrier substrates. This configuration would allow joint elements 1121-1123 to include solder masking thereon to better control solder flow, and techniques from land grid array (LGA) and board-to-board solder processes might be applied. Circuit board material or substrates can also be routed/shaped into more arbitrary shapes than conductive blocks, such as various bends/corners, and have economies of scale by manufacturing large arrays of joint elements which are stamped or cut into individual pieces. In further examples, the gapping at block joints 1115-1117 between individual conductive modular blocks can be increased and then spanned by a corresponding length of a joint element. This gapping can allow for use of less material in the BLC, or as a bridge over underlying traces by omitting block material from selected places (similar in function to bridge blocks 451-452 of FIG. 4). Automated placement software can include options to route other signals through gapping at block joints 1115-1117 on the corresponding circuit board.

View 1101 illustrates BLC 1130 which is formed from a plurality of conductive modular blocks 1131-1134 with an overlapping arrangement, although a different number of blocks can be included. Conductive modular blocks 1131-1134 can include any of the various types of conductive modular blocks discussed herein, and generally cuboid types are included in view 1101 for clarity. During operation, current can flow through BLC 1130 by taking a route which passes through conductively coupled portions of individual blocks and joint elements.

Horizontal joints 1134-1136 are included as overhanging or overlapping portions of each conductive block and produce a tiled or interlocking layered arrangement among conductive modular blocks 1131-1134. This tiled or interlocking arrangement can optionally be included with (or formed from) tessellation features discussed in FIG. 9.

Advantageously, formation of BLC 1130 can omit solder or reflowable material in vertical joints 1145-1147 between conductive modular blocks 1131-1134, and any included vertical joints can be less sensitive to solder reflow/wicking/ wetting. This can provide case in manufacturing and include solder application only on horizontal surfaces or joints, such as shown for horizontal joints 1134-1136 between conductive modular blocks and joint elements. In further examples, gapping can be included at vertical joints 1145-1147 between individual conductive modular blocks can be increased and then spanned by a corresponding length of horizontally-spanning portions of the blocks. This gapping can allow for use of less material in the BLC, or as a bridge over underlying traces by omitting block material from selected places (similar in function to bridge blocks 451-452 of FIG. 4). Automated placement software can include options to route other signals through gapping at block joints 1145-1147 on the corresponding circuit board.

Certain inventive aspects may be appreciated from the foregoing disclosure, of which the following are various examples.

Example 1: A method comprises providing a circuit board having footprint elements that define a route between endpoints, applying solder paste onto the footprint elements, and placing modular conductive blocks along the route onto the solder paste associated with the footprint elements. The method also includes forming, by at least a solder reflow operation, an assembly comprising the circuit board and the modular conductive blocks that establishes a conductive pathway along the route with series coupling of the modular conductive blocks to each other.

Example 2: The method of example 1, comprising applying insulating caps along the route which cover the modular conductive blocks and attach to the circuit board.

Example 3: The method of examples 1-2, comprising establishing an insulating layer over the modular conductive blocks by at least providing a material configured to remain on or migrate to exterior surfaces of the modular conductive blocks during the solder reflow operation or a secondary reflow operation.

Example 4: The method of examples 1-3, wherein the modular conductive blocks comprise a conductive body member spanning between end portions, and wherein at least the end portions couple to the footprint elements.

Example 5: The method of examples 1-4, wherein the conductive body member comprises a material configured to at least partially reflow during the solder reflow operation.

Example 6: The method of examples 1-4, wherein the conductive body member comprises a material configured to remain solid during the solder reflow operation.

Example 7: The method of examples 1-6, wherein at least one of the modular conductive blocks comprises a bridge section configured to span over and electrically isolate an underlying trace of the circuit board from the conductive pathway.

Example 8: The method of examples 1-7, wherein the modular conductive blocks comprise interlocking end features configured to interlock adjacent ones of the modular conductive blocks during the solder reflow operation.

Example 9: The method of examples 1-8, wherein the route spans from a first surface of the circuit board to a second surface of the circuit board, and comprising providing at least one modular conductive block that establishes the conductive pathway from the first surface through a hole that penetrates the circuit board and to a further portion of the conductive pathway on the second surface.

Example 10: The method of examples 1-9, wherein the footprint elements comprise a trace on the circuit board defining the route, and wherein the modular conductive blocks couple to each other and to the trace during the solder reflow operation to form the conductive pathway as comprising a higher current pathway than the trace.

Example 11: An assembly, comprising a circuit board comprising a route and a series of modular conductive blocks soldered onto footprint elements placed onto the circuit board along the route. Wherein each of the modular conductive blocks has a longitudinal body comprising an electrically conductive material and are configured to electrically couple at end portions to one or more adjacent conductive blocks.

Example 12: The assembly of example 11, comprising insulating caps applied along the route configured to electrically insulate at least a portion of exposed surfaces of the modular conductive blocks.

Example 13: The assembly of examples 11-12, comprising an insulating layer formed on the modular conductive blocks from a material configured to remain on or migrate to exterior surfaces of the modular conductive blocks during one or more reflow operations used to couple the modular conductive blocks to the circuit board.

Example 14: The assembly of examples 11-13, wherein the electrically conductive material of the longitudinal bodies comprise a material configured to at least partially reflow during a solder reflow operation used to couple the modular conductive blocks to the circuit board.

Example 15: The assembly of examples 11-14, wherein the electrically conductive material of the longitudinal bodies comprise a material configured to remain solid during a solder reflow operation used to couple the modular conductive blocks to the circuit board.

Example 16: The assembly of examples 11-15, wherein at least one of the modular conductive blocks comprises a bridge section configured to span over and electrically isolate from an underlying trace of the circuit board.

Example 17: The assembly of examples 11-16, wherein the modular conductive blocks comprise interlocking end features configured to interlock adjacent ones of the modular conductive blocks during a solder reflow operation used to couple the modular conductive blocks to the circuit board.

Example 18: The assembly of examples 11-17, wherein the footprint elements comprise a trace on the circuit board defining the route, and wherein the modular conductive blocks couple to each other and to the trace during a solder reflow operation to form a conductive pathway comprising a higher current pathway than the trace.

Example 19: A method, comprising providing a circuit board layout. In the circuit board layout, the method includes routing a conductive link defined by a sequence of surface mount conductive bricks, and generating a manufacturing description for the circuit board layout that includes the conductive link.

Example 20: The method of example 19, comprising employing the manufacturing description to direct manufacture of a printed circuit board assembly including pick-and-place operations for mounting the conductive bricks onto footprints established on the printed circuit board.

While the term adjacent is employed herein, with regard to conductive modular blocks that form a BLC, it should be understood that adjacent can refer to substantially adjacent, proximate, or similar. The terms proximate or adjacent refer to the property that, when blocks are placed proximate or adjacent, the at least partially melting of a reflow operation results in a first block conductively connecting or coupling (e.g., fusing) with at least one other block. The distance between blocks (post-reflow) is selected to meet or exceed the desired current carrying capacity by inter-block connections forming a BLC. For blocks having insulation or shielding, the distance may further depend on the maximum unshielded gap between blocks, such as to meet safety regulations, sparking requirements, EMI requirements, or other various design goals.

The functional block diagrams, operational scenarios and sequences, and flow diagrams provided in the Figures are representative of exemplary systems, environments, and methodologies for performing novel aspects of the disclosure. The descriptions and figures included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the invention. Those skilled in the art will also appreciate that the features described above can be combined in various ways to form multiple implementations. As a result, the invention is not limited to the specific implementations described above, but only by the claims and their equivalents.

The various materials and manufacturing processes discussed herein are employed according to the descriptions above. However, it should be understood that the disclosures and enhancements herein are not limited to these materials and manufacturing processes, and can be applicable across a range of suitable materials and manufacturing processes. Thus, the descriptions and figures included herein depict specific implementations to teach those skilled in the art how to make and use the best options. For the purpose of teaching inventive principles, some conventional aspects have been simplified or omitted. Those skilled in the art will appreciate variations from these implementations that fall within the scope of this disclosure. Those skilled in the art will also appreciate that the features described above can be combined in various ways to form multiple implementations.

What is claimed is:

1. An assembly, comprising:

a circuit board comprising a route; and a board level cable comprising a series of modular blocks;

the modular blocks comprising:

cuboid bodies formed from an electrically conductive reflowable solder material; and faces comprising outer surfaces of the cuboid bodies;

wherein adjacent modular blocks of the series of modular blocks are directly attached to and reflow soldered at end faces; and wherein bottom faces of the modular blocks are directly attached to and are reflow soldered to the circuit board using footprint elements placed along the route.

2. The assembly of claim 1, comprising:

insulating caps applied along the route configured to electrically insulate at least a portion of exposed faces of the modular blocks.

3. The assembly of claim 1, comprising:

an insulating layer formed on the faces of the modular blocks from a material configured to remain on or migrate to exterior surfaces of the modular blocks during one or more solder reflow operations used to couple the modular blocks to each other or to the circuit board.

4. The assembly of claim 1, wherein the electrically conductive reflowable solder material of the modular blocks comprise a first material composition that reflows at a different temperature or duration of temperature than a second material composition used for attachment of other electrical components to the circuit board.

5. The assembly of claim 1, wherein the electrically conductive reflowable solder material of the modular blocks comprise a material configured to remain solid during a solder reflow operation used to couple the modular blocks to the footprint elements of the circuit board.

6. The assembly of claim 1, wherein at least one of the modular blocks comprises a bridge section configured to span over and electrically isolate from an underlying trace of the circuit board.

7. The assembly of claim 1, wherein the modular blocks comprise interlocking end features on the end faces configured to interlock adjacent ones of the modular blocks during a solder reflow operation used to couple the modular blocks to the footprint elements of the circuit board.

8. The assembly of claim 1, wherein the footprint elements comprise a trace on the circuit board defining the route; and wherein the modular blocks couple to each other and to the trace during a solder reflow operation to form a conductive pathway comprising a higher current pathway than the trace.

\* \* \* \* \*